United States Patent [19]
Fujimoto et al.

[11] Patent Number: 5,276,414
[45] Date of Patent: Jan. 4, 1994

[54] MOISTUREPROOF STRUCTURE FOR MODULE CIRCUITS

[75] Inventors: Takamitsu Fujimoto; Satoshi Yanaura; Atsuko Noda; Takeji Fujiwara; Hiroyuki Sato; Fumiaki Baba, all of Hyogo, Japan

[73] Assignee: Mitsubishi Denki Kabushiki Kaisha, Tokyo, Japan

[21] Appl. No.: 939,734

[22] Filed: Sep. 2, 1992

[30] Foreign Application Priority Data

Dec. 10, 1991 [JP] Japan .................. 3-325443
Mar. 6, 1992 [JP] Japan .................. 4-049382

[51] Int. Cl.⁵ .............................. H01P 1/30
[52] U.S. Cl. .............................. 333/246; 257/788; 257/790
[58] Field of Search .............. 333/246, 247; 257/664, 257/687, 704, 728, 729, 787, 788, 790–793; 174/251, 256, 258

[56] References Cited

U.S. PATENT DOCUMENTS

| | | | |
|---|---|---|---|
| 3,768,048 | 10/1973 | Jones, Jr. et al. | 333/246 X |
| 4,768,081 | 8/1988 | Moeller | 257/791 X |
| 4,814,943 | 3/1989 | Okuaki | 257/787 X |
| 4,888,226 | 12/1989 | Wong | 257/788 X |
| 5,034,801 | 7/1991 | Fischer | 257/687 |
| 5,041,395 | 8/1991 | Steffen | 257/687 X |
| 5,130,780 | 7/1992 | Kumai et al. | 257/791 |

FOREIGN PATENT DOCUMENTS

| | | | |
|---|---|---|---|
| 64-17492 | 1/1989 | Japan . | |
| 3-124052 | 5/1991 | Japan . | |
| 2098800 | 11/1982 | United Kingdom | 257/790 |

Primary Examiner—Paul Gensler
Attorney, Agent, or Firm—Burns, Doane, Swecker & Mathis

[57] ABSTRACT

The improved moistureproof structure for a module circuit is characterized in that a porous film conditioned to have an apparent relative dielectric constant of no more than 2.0 is coated over a stripline a high-frequency circuit, or a high-frequency device formed on a substrate, which porous film may in turn be provided with a resin coating material. The structure insures that the module circuit is moistureproof, thereby protecting it against corrosion to improve its operational reliability without affecting its electrical characteristics.

12 Claims, 1 Drawing Sheet

MOISTUREPROOF STRUCTURE FOR MODULE CIRCUITS

BACKGROUND OF THE INVENTION

This invention relates to a moistureproof structure for module circuits. More particularly, this invention relates to a moistureproof structure for module circuits that are to be used at high frequencies not lower than a few GHz.

A class of module circuits that are used at high frequencies not lower than a few GHz are conventionally composed of coaxial lines or triplet lines so that the circuits are protected against wire corrosion and variations in electrical characteristics due to moisture and vapor condensation. Another class of module circuits having striplines formed on a substrate to provide electronic circuits are either sealed in ceramic containers or provided with a moistureproof coat as described in Japanese Patent Public Disclosure No. 17492/1989, whereby the circuits are protected against wire corrosion and variations in electrical characteristics.

However, the moistureproof structures that use coaxial lines require cumbersome connecting operations and those which use triplet lines take much time to form the desired circuit. Hence, either type of structure suffers from the disadvantage of increased production cost.

The moistureproof structures that use striplines are free from the problem associated with wire connecting and circuit forming operation. However, if ceramic containers are used, problems arise such as the high cost of ceramic containers and unsuitability for high-volume production.

If moistureproof coats are applied, the electrical characteristics of the circuit will vary greatly since the dielectric constant of the coating material is substantially higher than that of air. It is theoretically possible to design the circuit allowing for the possible variations in electrical characteristics but, in practice, the electrical characteristics of the circuit will vary with the thickness of the moistureproof coat, and it is necessary to insure that the circuit is always coated with the correct thickness of the coat that complies with the circuit design. However, controlling thicknesses of less than a hundred microns within the limits of ± a few microns is very difficult to accomplish. In addition, the condensation of water vapor on the moistureproof coat over striplines is particularly undesirable since water having a relative dielectric constant as large as about 80 will have large effects on the electrical characteristics of the circuit. In order to avoid the adverse effect of vapor condensation by means of the moistureproof coat, it must have a thickness of at least 1 mm; however, if a moistureproof coating material which has a high dielectric constant is formed at a thickness of 1 mm and more, the coating material alone is sufficient to cause variations in the electrical characteristics of the circuit that are too great to be effectively absorbed by circuit design.

SUMMARY OF THE INVENTION

The present invention has been accomplished under these circumstances and has as an object providing a moistureproof structure for module circuits that are composed of striplines which permit a desired high-frequency circuit to be fabricated easily, which structure is capable of assuring impermeability to moisture while leaving the electrical characteristics of the circuits almost unchanged.

This object of the present invention can be attained by a moistureproof structure for a module circuit in which the stripline on the substrate of a module including a high-frequency circuit and/or a high-frequency device is covered with a water-repellent porous film having an apparent relative dielectric constant of 2.0 or less.

The object of the present invention can also be attained by a moistureproof structure for a module circuit formed on a substrate that includes a high-frequency circuit and/or a high-frequency device, in which at least part of said module circuit is provided with a porous film having an apparent relative dielectric constant of 2.0 or less, which porous film in turn is provided with a resin coating material.

The term "module circuit" as used herein should be taken broadly to mean not only striplines, circuit elements and high-frequency devices such as GaAs ICs and MM ICs that are formed on a substrate, but also complex circuits in which they are combined. The moistureproof structure for module circuits according to the present invention may be applied to part of the module circuit as defined above. The term "apparent relative dielectric constant" as used herein means not the relative dielectric constant of the porous film in bulk form but the relative dielectric constant of said porous film as it contains the bubbles of a gas such as air in pores.

In the moistureproof structure of the present invention, the apparent relative dielectric constant of the porous film coated on the module circuit is very close to that of air, so that the electrical characteristics of the circuit are hardly affected by the film. Further, the porous film is water repellent, so it can effectively protect the circuit against moisture to fabricate a module circuit that is improved in both high-frequency characteristics and operational reliability. If the porous film is provided with the resin coating material, circuit protection against moisture is further enhanced to enable the fabrication of a module circuit that has even better high-frequency characteristics and higher reliability.

DETAILED DESCRIPTION OF THE INVENTION

The present invention is described below in detail with reference to the accompanying drawings.

Figure 1:
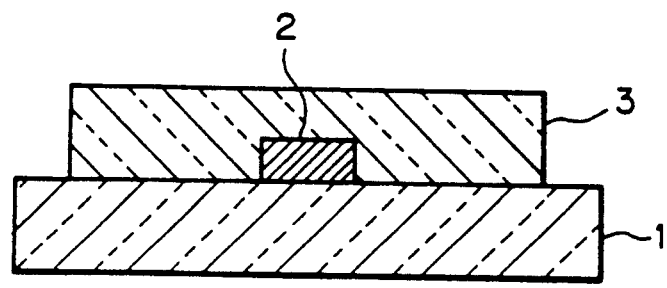
FIG. 1 is a simplified cross-sectional view showing a moistureproof structure for a module circuit according to a first aspect of the present invention in which the module circuit is covered with a porous film.
Figure 2:
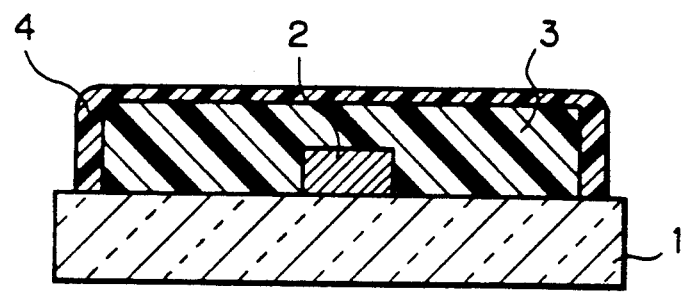
FIG. 2 is a simplified cross-sectional view showing a moistureproof structure for a module circuit according to a second aspect of the present invention in which the module circuit is covered with a porous film which in turn is provided with a resin coating.

FIGS. 1 and 2 are simplified cross-sectional views showing moistureproof structures for a module circuit according to the first and second aspects, respectively, of the present invention. Shown by 1 is a substrate having a conductor layer deposited on the back side; 2 is a wire such as a stripline; 3 is a porous film whose porosity is adjusted to provide an apparent relative dielectric constant of 2.0 or less; and 4 is a resin coating material.

The porous film 3 is formed over the substrate 1 and the wire 2, optionally with a silicone, fluorine or otherwise based coating material being interposed. If desired, the substrate and/or the porous film may be preliminarily treated with a silane coupling agent, a silicone-based primer (e.g. "Primer A" of Shin-Etsu Chemical Co., Ltd. or "Primer D" of Toray Dow-Corning Silicone Co., Ltd.), etc.

Specific examples of the porous film include those which are made of polytetrafluoroethylene (PTFE), polyethylene (PE), polypropylene (PP), polystyrene (PS), isomers thereof, and copolymers of tetrafluoroethylene, ethylene, propylene or styrene. If the apparent relative dielectric constant of these porous films exceeds 2.0, they will cause adverse effects on the electrical characteristics of the circuit. Hence, the porous films should not have an apparent relative dielectric constant of more than 2.0, preferably not more than 1.5. Depending on the relative dielectric constant of the film in bulk form, a porosity of 5-90% is necessary to achieve an apparent relative dielectric constant of 2.0 and below and the porosity of the film is adjusted so it will have an apparent relative dielectric constant that does not exceed 2.0. A properly adjusted porous film can be formed by, for example, stretching the film in bulk form.

The porous film preferably has a thickness of at least 0.1 mm, more preferably in the range of 0.5-2.0 mm. If the thickness of the porous film is less than 0.1 mm, it is sometimes impossible to eliminate the adverse effect of the water condensation. The electrical characteristics of the circuit are hardly affected even if the thickness of the porous film exceeds 2.0 mm. However, for achieving high-density packaging, it is desired that the thickness of the porous film does not exceed 2.0 mm.

Examples of the resin coating material that can be formed over the porous film include those which are based on silicone such as a silicone rubber, a silicone gel, and silicone resins such as silica, epoxy resins loaded with fillers such as silica and alumina, and fluorine resins.

To insure the necessary impermeability to moisture for circuits and devices, the resin coating materials mentioned above preferably have minimum contents of chlorine ions, sodium ions or compounds containing those ions.

The moistureproof structure for module circuits of the present invention is described below more specifically with reference to the following examples, to which the scope of the present invention is in no way limited.

EXAMPLE 1

Gore-Tex films having a thickness of 1 mm and apparent relative dielectric constants of 1.2 and 1.6 (porous PTFE films produced by Japan Gore-Tex Co., Ltd.) and a porous polyethylene film also 1 mm thick but having an apparent relative dielectric constant of 1.5 were placed on the circuits of a band rejection filter (BRF) each formed on alumina ceramic substrate and, the films were lightly depressed in such a way that they would cover the BRF circuit as they contained air bubbles. Each of the BRF circuits was composed of a microstripline formed on the alumina ceramic substrate.

In place of the porous films, a silicone potting material (JCR 6143 produced by Toray Dow-Corning Silicone Co., Ltd.) was coated in thicknesses of 30 μm and 1 mm and cured by heating at 150° C. for 2 h to prepare comparative samples.

The transmission loss of each sample was measured at a frequency of about 10 GHz with or without water drops on the porous films or silicone potting material. The results are shown in Table 1 below.

TABLE 1

|  |  | Example 1 | | | Comparative Example | | |
|---|---|---|---|---|---|---|---|
|  |  | Gore-Tex film | | PE film | Substrate alone | Silicone potting material | |
|  |  | $\epsilon = 1.2$ | $\epsilon = 1.6$ | $\epsilon = 1.5$ |  | 30 μm | 1 mm |
| Transmission loss [dB] | without H₂O drops | 0.8 | 0.9 | 0.9 | 0.7 | 0.8 | 3.0 |
|  | with H₂O drops | 1.1 | 1.2 | 1.2 | 5.0 | 5.0 | — |

The samples of Example 1 suffered from transmission losses of the BRF circuit that were substantially the same as the initial loss and even when water drops were deposited on the porous films, their performance was affected only slightly, exhibiting superior moisture resistance. The comparative sample having a 1-mm thick coating of the silicone potting material suffered a 3-dB loss in the BRF circuit which was so much greater than the initial value that it was unnecessary to investigate the effect of waterdrops.

EXAMPLE 2

The thickness of a Gore-Tex film having an apparent relative dielectric constant of 1.2 that was of the same type as used in Example 1 was varied at 0.5 mm, 1.0 mm and 2.0 mm and these three thicknesses were bonded to BRF circuits with a silicone potting material (JCR 6143) being interposed in a thickness of about 10 μm and cured by heating at 150° C. for 2 h.

The samples thus prepared were subjected to the same evaluation as in Example 1 and the results are shown in table 2 below.

TABLE 2

|  |  | Example 2 | | |
|---|---|---|---|---|
|  |  | Silicone potting material + Gore-Tex film ($\epsilon = 1.2$) | | |
|  |  | 0.5 mm | 1.0 mm | 2.0 mm |
| Transmission los [dβ] | without H₂O drops | 0.9 | 1.0 | 1.1 |
|  | with H₂O drops | 1.7 | 1.2 | 1.2 |

As in Example 1, the samples of Example 2 suffered from transmission losses of the BRF circuit that were substantially the same as the initial loss and even when water drops were deposited on the porous film, their performance was affected only slightly. The same results were obtained when evaluating for the shift in rejection frequency.

EXAMPLE 3

Using evaluation substrates each carrying opposed thin-film wires of Cr and Au on an alumina ceramic base, a Gore-Tex film having an apparent relative dielectric constant of 1.2 that was of the same type as used in Example 1 but which was varied in thickness at 0.5 mm, 1.0 mm and 2.0 mm was bonded to the substrates with a silicone potting material (JCR 6143) being interposed in a thickness of about 10 μm and cured by heating at 150° C. for 2 h.

The thus prepared samples were evaluated for their moisture resisting property. The same evaluation was conducted on only the alumina ceramic substrate carrying opposed thin-film wires of Cr and Au. The conditions of the evaluation were as follows: the specimens were subjected to a PCT (pressure cooker test) at 121° C. under 2 atmospheres with a dc bias of 5 volts being applied, and the resulting change in the insulation resistance of the wires due to migration was investigated. The results of the evaluation are shown in Table 3.

TABLE 3

|  | Example 3 | | | Comparative Example |
|---|---|---|---|---|
|  | Silicone potting material + Gore-Tex film (ε = 1.2) | | | Substrate alone |
|  | 0.5 mm | 1.0 mm | 2.0 mm |  |
| 10 min | >10$^{13}$ | >10$^{13}$ | >10$^{13}$ | 10$^6$ |
| 200 h | >10$^{13}$ | >10$^{13}$ | >10$^{13}$ | — |

(Numberals in the table are in ohms.)

The alumina ceramic substrate having the opposed wires of Cr and Au formed thereon had the line insulation resistance dropped to 10$^6$ Ω in about 10 min; however, the samples having the porous film bonded to the wires with JCR 6143 being interposed experienced no drop in insulation resistance until 200 h.

EXAMPLE 4

Gore-Tex films having a thickness of 1 mm and apparent relative dielectric constants of 1.2 and 1.6 (porous PTFE films produced by Japan Gore-Tex Co., Ltd.) and a porous polyethylene film also 1 mm thick but having an apparent relative dielectric constant of 1.5 were placed on the circuits of a band rejection filter (BRF) each formed on an aluminum ceramic substrate; the porous films were then sealed with a potting silicone resin (JCR 6143 Toray Dow-Corning Silicone Co., Ltd.; hereunder referred to simply as JCR 6143) to prepare samples. Each of the BRF circuits was composed of a microstripline formed on the alumina ceramic substrate. In place of the porous films, JCR 6143 was coated in thicknesses of 30 μm and 1 mm and cured by heating at 150° C. for 2 h to prepare comparative samples.

The transmission loss of each sample was measured at a frequency of about 10 GHz with or without water drops on the silicone potting material. The results are shown in Table 4 below.

TABLE 4

|  |  | Example 4 | | | Comparative Example | | |
|---|---|---|---|---|---|---|---|
|  |  | Gore-Tex film/JCR 6143 | | PE film/ JCR 6143 | Substrate alone | Silicone potting material | |
|  |  | ε = 1.2 | ε = 1.6 | ε = 1.5 |  | 30 μm | 1 mm |
| Transmission less [dB] | without H$_2$O drops | 0.9 | 1.0 | 1.0 | 0.7 | 0.8 | 3.0 |
|  | with H$_2$O drops | 1.1 | 1.2 | 1.2 | 5.0 | 5.0 | — |

As one can see from Table 4, the transmission loss that occurred in the samples of Example 4 hardly increased even when water drops were deposited on the silicone potting material. However, the substrate alone or the comparative sample which were directly coated with the silicone potting material experienced a substantial increase in transmission loss in the presence of water drops. The comparative sample having a 1-mm thick coating of the silicone potting material suffered a 3-dB loss in the BRF circuit which was so much greater than the initial value that it was unnecessary to investigate the effect of water drops.

EXAMPLE 5

The thickness of a Gore-Tex film having an apparent relative dielectric constant of 1.2 that was of the same type as used in example 4 was varied at 0.5 mm, 1.0 mm and 2.0 mm and these three thicknesses were bonded to BRF circuits with a silicone potting material (JCR 6143) being interposed in a thickness of about 10 μm and cured by heating at 150° C. for 2 h. The Gore-Tex films were then coated with a silicone gel (SE 1880 of Toray Dow-Corning Co., Ltd; hereunder referred to simply as SE 1880) or a liquid epoxy resin ("Semicoat 220" of shin-Etsu Chemical Co., Ltd.; hereunder-referred to simply as "Semicoat 220"); SE 1880 was cured by a heat treatment at 125° C. for 2 h whereas Semicoat 220 was cured by a heat treatment at 100° C. for 1 h followed by heating at 150° C. for 4 h.

The samples thus prepared were evaluated by the same method as example 4 and the results are shown in Table 5 below.

TABLE 5

|  |  | Example 5 | | | | | |
|---|---|---|---|---|---|---|---|
|  |  | SE 1880 coating Thickness of Gore-Tex film (ε = 1.2) | | | Semicoat 220 coating Thickness of Gore-Tex film (ε = 1.2) | | |
|  |  | 0.5 mm | 1.0 mm | 2.0 mm | 0.5 mm | 1.0 mm | 2.0 mm |
| Transmission loss [dβ] | without H$_2$O drops | 1.3 | 1.1 | 1.1 | 1.6 | 1.3 | 1.3 |

TABLE 5-continued

| | | Example 5 | | | | |
|---|---|---|---|---|---|---|
| | | SE 1880 coating Thickness of Gore-Tex film ($\epsilon = 1.2$) | | | Semicoat 220 coating Thickness of Gore-Tex film ($\epsilon = 1.2$) | | |
| | | 0.5 mm | 1.0 mm | 2.0 mm | 0.5 mm | 1.0 mm | 2.0 mm |
| with H$_2$O drops | | 1.7 | 1.2 | 1.2 | 1.8 | 1.4 | 1.4 |

As one can see from Table 5, when the porous PTFE film was as thin as 0.5 mm, the transmission loss was somewhat great; however, all samples suffered from transmission losses of the BRF circuit that were substantially the same as the initial loss and even when water drops were deposited on the porous films, their performance was affected only slighty. The same results were obtained when evaluating for the shift in rejection frequency.

EXAMPLE 6

Using evaluation substrates each carrying opposed thin-film wires of Cr and Au on an alumina ceramic base, a Gore-Tex film having an apparent relative dielectric constant of 1.2 that was of the same type as used in Example 4 but which was varied in thickness at 0.5 mm, 1.0 mm and 2.0 mm was bonded to the substrates with a silicone potting material (JCR 6143) being interposed in a thickness of about 10 μm and cured by heating at 150° C. for 2 h.

The thus prepared samples were evaluated for their moisture resisting property. The same evaluation was conducted on only the alumina ceramic substrate carrying opposed thin-film wires of Cr and Au. The conditions of the evaluation were as follows: the specimens were subjected to a PCT (pressure cooker test) at 121° C. under 2 atmospheres with a dc bias of 5 volts being applied, and the resulting change in the insulation resistance of the wires due to migration was investigated. The results of the evaluation are shown in Table 6.

TABLE 6

| | Example 6 | | | (in ohms) |
|---|---|---|---|---|
| PCT time | Thickness of Gore-Tex film ($\epsilon = 1.2$) | | | Comparative Example |
| | 0.5 mm | 1.0 mm | 2.0 mm | Substrate alone |
| 10 min | >10$^{13}$ | >10$^{13}$ | >10$^{13}$ | 10$^6$ |
| 200 h | >10$^{13}$ | >10$^{13}$ | >10$^{13}$ | — |

The alumina ceramic substrate having the opposed wires of Cr and Au formed thereon had the line insulation resistance dropped to 10$^6$ Ω in about 10 min; however, the samples having the porous film bonded to the wires with JCR 6143 being interposed, which in turn was coated with JCR experienced no drop in insulation resistance until 200 h.

The moistureproof structure for module circuits according to the first aspect of the present invention is such that a water-repellent porous film having an apparent relative dielectric constant of no more than 2.0 is provided over the high-frequency circuit; hence, the structure exhibits superior impermeability to moisture causing little effect on the electrical characteristics of the circuit, and this renders the structure to be useful advantageously with circuits such as high-frequency modules.

The moistureproof structure for module circuits according to the second aspect of the present invention is such that a porous film having an apparent relative dielectric constant of no more than 2.0 is provided over the high-frequency circuit, which porous film in turn is provided with a resin coating; hence, the structure exhibits superior impermeability to moisture causing little effect on the electrical characteristics of the circuit, and this renders the structure to be useful advantageously with circuits such as high-frequency modules.

As the overall result, the present invention enables module circuits of high characteristics to be produced at a lower cost, thereby expanding the scope of applicability of high-frequency operating equipment and machines.

What is claimed is:

1. A moistureproof structure for a module circuit in which a stripline on the substrate of a module including a high-frequency apparatus is covered with a water-repellent porous film having an apparent relative dielectric constant of 2.0 or less wherein the film has a 5-90% porosity to achieve said dielectric constant, and a thickness in the range of 0.5-2.0 mm to eliminate adverse effects of vapor condensation and to maintain electrical characteristics of the circuit.

2. The structure according to claim 1, wherein the high-frequency apparatus comprises a high frequency circuit.

3. The structure according to claim 1, wherein the high-frequency apparatus comprises a high frequency device.

4. The structure of claim 1, wherein the porous film is made of a material selected from the group consisting of polytetrafluoroethylene, polyethylene, polypropylene, polystyrene, isomers thereof, and copolymers of tetrafluoroethylene, ethylene, propylene or styrene.

5. A moistureproof structure for a module circuit formed on a substrate that includes a high-frequency apparatus, in which at least part of said module circuit is provided with a porous film having an apparent relative dielectric constant of 2.0 or less wherein the film has a 5-90% porosity to achieve said dielectric constant, and a thickness in the range of 0.5-2.0 mm to eliminate adverse effects of vapor condensation and to maintain electrical characteristics of the circuit, which porous film in turn is provided with a resin coating material.

6. The structure according to claim 5, wherein the high-frequency apparatus comprises a high frequency circuit.

7. The structure according to claim 5, wherein the high-frequency apparatus comprises a high frequency device.

8. The structure of claim 5, wherein the porous film is made of a material selected from the group consisting of polytetrafluoroethylene, polyethylene, polypropylene, polystyrene, isomers thereof, and copolymers of tetrafluoroethylene, ethylene, propylene or styrene.

9. The structure of claim 8, wherein the resin coating material is a material which is based on silicone, selected from the group consisting of silicon rubber, a silicone gel, silicone resins such as silica, epoxy resins loaded with fillers such as silica and alumina, and fluorine resins.

10. The structure of claim 9, wherein the resin coating material has a minimum content of chlorine ions, sodium ions and compounds containing chlorine or sodium ions.

11. The structure of claim 5, wherein the resin coating material is a material which is based on silicone, selected from the group consisting of silicon rubber, a silicone gel, silicone resins such as silica, epoxy resins loaded with fillers such as silica and alumina, and fluorine resins.

12. The structure of claim 11, wherein the resin coating material has a minimum content of chlorine ions, sodium ions and compounds containing chlorine or sodium ions.

* * * * *